(12) United States Patent
Fang et al.

(10) Patent No.: US 8,390,303 B2
(45) Date of Patent: Mar. 5, 2013

(54) METHOD FOR DETECTING PRESSURE ON TOUCH SENSING ELEMENT AND ELECTRONIC DEVICE USING THE SAME

(75) Inventors: Kuo Pin Fang, Taoyuan (TW); Shu Hung Tseng, Taoyuan (TW)

(73) Assignee: HTC Corporation (TW)

( * ) Notice: Subject to any disclaimer, the term of this patent is extended or adjusted under 35 U.S.C. 154(b) by 295 days.

(21) Appl. No.: 12/855,065

(22) Filed: Aug. 12, 2010

(65) Prior Publication Data

US 2011/0037487 A1 Feb. 17, 2011

(30) Foreign Application Priority Data

Aug. 12, 2009 (TW) .............................. 98127080 A

(51) Int. Cl.
*G01R 27/26* (2006.01)
(52) U.S. Cl. ....................................... 324/679; 324/678
(58) Field of Classification Search .................. 324/658, 324/672, 678, 679
See application file for complete search history.

(56) References Cited

U.S. PATENT DOCUMENTS

| 4,933,660 A * | 6/1990 | Wynne, Jr. ..................... 338/114 |
| 5,796,389 A | 8/1998 | Bertram et al. |
| 6,208,332 B1 | 3/2001 | Ikegami |
| 7,236,160 B2 | 6/2007 | Kong |
| 2006/0267953 A1 | 11/2006 | Peterson, Jr. et al. |

FOREIGN PATENT DOCUMENTS

| JP | 2004078606 A | 3/2004 |
| TW | 200732953 A | 9/2007 |
| TW | 200837618 A | 9/2008 |
| WO | 1994022026 A1 | 9/1994 |
| WO | 2010123191 | 10/2010 |

* cited by examiner

*Primary Examiner* — Vincent Q Nguyen

(57) ABSTRACT

A method for detecting pressure on a touch sensing element includes the steps of: providing a first potential difference to two electrodes of a first film; charging a capacitor with a division voltage of the first potential difference; sampling a charged voltage of the capacitor to obtain a plurality of first voltage values and calculating a first voltage variation according to the plurality of first voltage values; comparing the first voltage variation with a threshold value; and post-processing at least one of the first voltage values when the first voltage variation is smaller than the threshold value. The present disclosure further provides an electronic device.

20 Claims, 8 Drawing Sheets

METHOD FOR DETECTING PRESSURE ON TOUCH SENSING ELEMENT AND ELECTRONIC DEVICE USING THE SAME

CROSS REFERENCE TO RELATED APPLICATION

This application claims the priority benefit of Taiwan Patent Application Serial Number 098127080, filed on Aug. 12, 2009, the full disclosure of which is incorporated herein by reference.

BACKGROUND

1. Field of the Invention

This invention generally relates to a positioning device and, more particularly, to a method for detecting pressure on a resistive touch sensing element and an electronic device using the same.

2. Description of the Related Art

FIG. 1 shows a conventional 4-wire touch screen 9 that is composed of two flexible transparent resistive plates, an X resistive plate 91 and a Y resistive plate 92, separated by a gap, wherein the X resistive plate 91 and the Y resistive plate 92 are plane resistances and do not contact each other in natural state. On the X resistive plate 91, the resistance only changes with the position along an X direction. The X resistive plate 91 includes two electrodes $X^+$, $X^-$ disposed along the left and right sides of the X resistive plate 91 and a transparent resistive layer formed on the upper surface of the X resistive plate 91. On the Y resistive plate 92, the resistance only changes with the position along a Y direction. The Y resistive plate 92 includes two electrodes $Y^+$, $Y^-$ disposed along the front and back sides of the Y resistive plate 92 and a transparent resistive layer formed on the lower surface of the Y resistive plate 92, wherein the X direction and the Y direction are two directions perpendicular to each other.

FIG. 2 shows a cross-sectional view of the touch screen 9 being pressed. When a touch point P on the Y resistive plate 92 is pressed by a force F, a distance between the X resistive plate 91 and the Y resistive plate 92 at the touch point P decreases such that a contact resistance $R_{touch}$ changes to a definite value from an infinite value. When the force F is larger, the contact resistance $R_{touch}$ becomes smaller. In the touch screen 9, a contact pressure of the force F can be determined through calculating the contact resistance $R_{touch}$.

Please refer to FIGS. 3a to 3c, they show a conventional method for calculating the resistance value of the contact resistance $R_{touch}$. The contact resistance $R_{touch}$ may be obtained from equation (1), $$R_{touch}=(R_{x\_plate})\times[(X/2^n)\times(Z_2/Z_1)-1] \quad (1)$$

In equation (1), $R_{x\_plate}$ is a surface resistance of the X resistive plate 91; n is the resolution of an analog-to-digital converter (ADC) connected to a voltage detection point; X is a position of the touch point P in the X direction and it may be obtained according to the digital voltage outputted by the ADC shown in FIG. 3a; $Z_1$ is an input of the $Y^-$ electrode and it may be obtained according to the digital voltage outputted by the ADC shown in FIG. 3b; and $Z_2$ is an input of the $X^+$ electrode and it may be obtained according to the digital voltage outputted by the ADC shown in FIG. 3c.

However, the pressure detection method through calculating the resistance value of the contact resistance $R_{touch}$ has at least the following problems.

1. The resistance value of the contact resistance $R_{touch}$ is obtained through calculation, but the X in equation (1) is an uncertainty factor itself.
2. The resistance value of the contact resistance $R_{touch}$ is not equal to the pressure, and thus it only can be served as a reference value rather than a basis for representing actual pressure.
3. The range of the contact resistance $R_{touch}$ is very large and thus it is difficult to define a critical point according to the calculated resistance value such that the accuracy of identification is limited.

Accordingly, it is necessary to provide a method for detecting contact pressure on a touch sensing element with high accuracy so as to reduce the possibility of misidentification of a touch point.

SUMMARY

The present disclosure provides a method for detecting pressure on a touch sensing element and an electronic device using the same, wherein the method can identify a valid contact through sampling a plurality of voltage values of a capacitor and identifying whether the sampled voltage values reach a stable state.

The present disclosure provides a method for detecting pressure on a touch sensing element and an electronic device using the same, wherein the method compares a variation of sampled voltage values of a capacitor with a threshold value to identify whether the voltage values reach a stable state or not.

The present disclosure provides a method for detecting pressure on a touch sensing element which includes a first film and a second film each having two electrodes. The method includes the steps of: providing a first potential difference to the two electrodes of the first film; charging a capacitor with a division voltage of the first potential difference; sampling a charged voltage of the capacitor to obtain a plurality of first voltage values and calculating a first voltage variation according to the plurality of first voltage values; comparing the first voltage variation with a threshold value; and post-processing at least one of the first voltage values when the first voltage variation is smaller than the threshold value. The method for detecting pressure on a touch sensing element according to the present disclosure further includes the steps of: providing a second potential difference to the two electrodes of the second film; charging the capacitor with a division voltage of the second potential difference; sampling a charged voltage of the capacitor to obtain a plurality of second voltage values and calculating a second voltage variation according to the plurality of second voltage values; comparing the second voltage variation with the threshold value; ignoring the plurality of first and second voltage values when one of the first voltage variation and the second voltage variation is larger than the threshold value; and post-processing at least one of the first voltage values and at least one of the second voltage values when both the first voltage variation and the second voltage variation are smaller than the threshold value.

The present disclosure further provides an electronic device including a first film, a second film, a power source, a capacitor and a processing unit. The first and second films respectively have two electrodes. The power source is configured to provide a potential difference to the two electrodes of the first film or the two electrodes of the second film. The capacitor is configured to be selectively coupled to one of the two electrodes of the first film or one of the two electrodes of the second film, and to be charged by a division voltage of the potential difference on the electrode coupled thereto. The processing unit is configured to sample a charged voltage of the capacitor to obtain a plurality of voltage values, to calculate a voltage variation according to the plurality of voltage values, and to compare the voltage variation with a threshold value, wherein the processing unit post-processes at least one of the plurality of voltage values when the voltage variation is smaller than the threshold value.

The present disclosure further provides a method for detecting pressure on a touch sensing element which includes a first film and a second film each having two electrodes. The method includes the steps of: providing a first potential difference to the two electrodes of the first film; charging a capacitor with a division voltage of the first potential difference; sampling a charged voltage of the capacitor to obtain a plurality of first voltage values; identifying whether the first voltage values reach a stable state; ending pressure detecting when the first voltage values do not reach the stable state; when the first voltage values reach the stable state, the method further including the steps of: providing a second potential difference to the two electrodes of the second film; charging the capacitor with a division voltage of the second potential difference; sampling a charged voltage of the capacitor to obtain a plurality of second voltage values; identifying whether the second voltage values reach the stable state; ending pressure detecting when the second voltage values do not reach the stable state; post-processing at least one of the first voltage values and at least one of the second voltage values when the second voltage values reach the stable state.

In the present disclosure, when a touch sensing element is pressed by a force, a potential difference is applied to two electrodes of the X-film (or the Y-film) within a first time period to allow an electrode of the Y-film (or the X-film) to charge a capacitor, and a charged voltage of the capacitor is sampled within a second time period. When a variation of the charged voltage of the capacitor charged by any film does not reach a stable state, the touch is determined to be invalid. In addition, a length of the second time period and the number of sampled charged voltages may be determined according to the detection accuracy required by a touch sensing element.

In the present disclosure, the step of post-processing the first and second voltage values further includes the steps of: calculating a position coordinate according to at least one of the first voltage values and at least one of the second voltage values; and executing a function corresponding to the position coordinate.

BRIEF DESCRIPTION OF THE DRAWINGS

Other objects, advantages, and novel features of the present invention will become more apparent from the following detailed description when taken in conjunction with the accompanying drawings.

FIG. 4c shows an equivalent circuit diagram of the electronic device shown in FIG. 4a.

DETAILED DESCRIPTION OF THE EMBODIMENT

Figure 1:
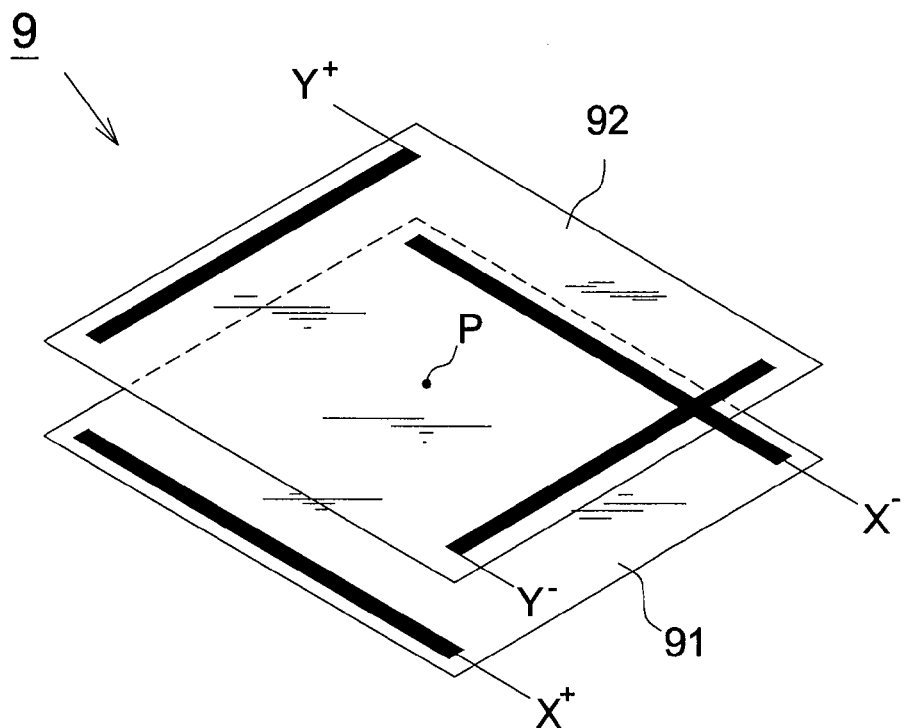
FIG. 1 shows a schematic diagram of two resistive plates of the conventional resistive touch screen.
Figure 2:
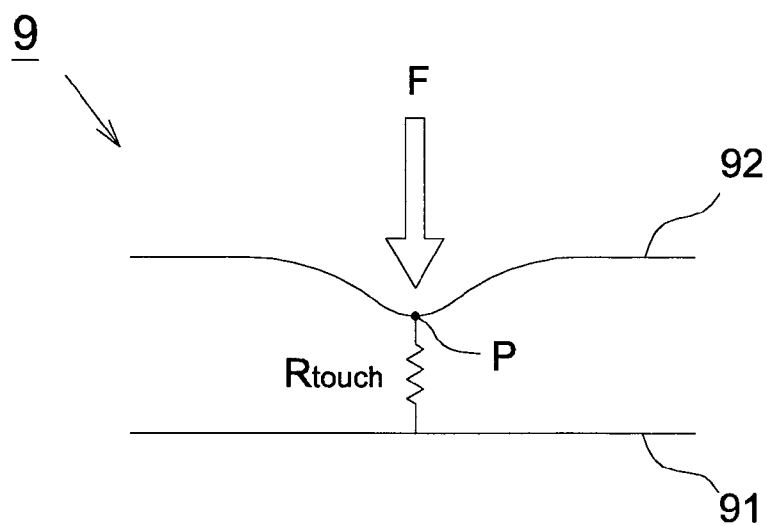
FIG. 2 shows a cross-sectional view of the touch screen shown in FIG. 1, wherein the touch screen is being pressed by a force.
Figure 3A:
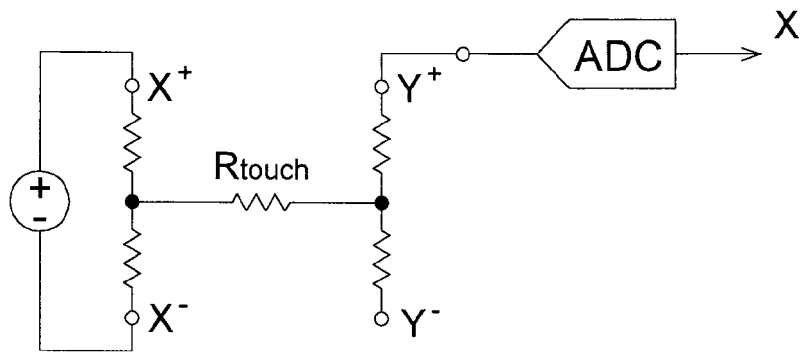
FIGS. 3a-3c show conventional equivalent circuit diagrams for calculating the contact resistance of touch screen.
Figure 3B:
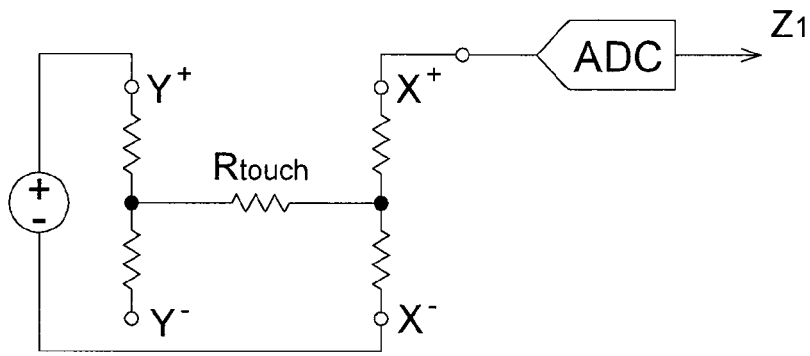
Figure 3C:
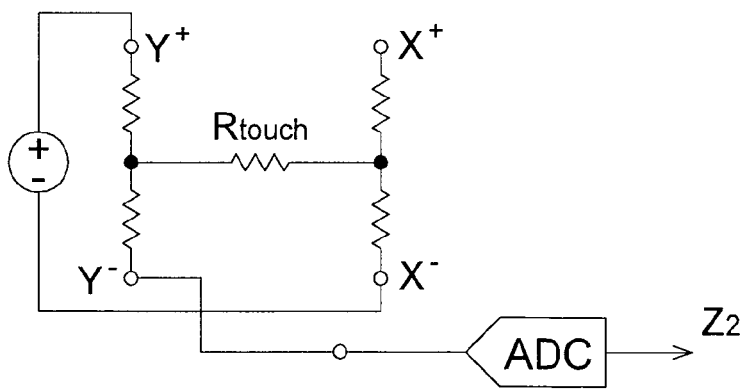
Figure 4A:
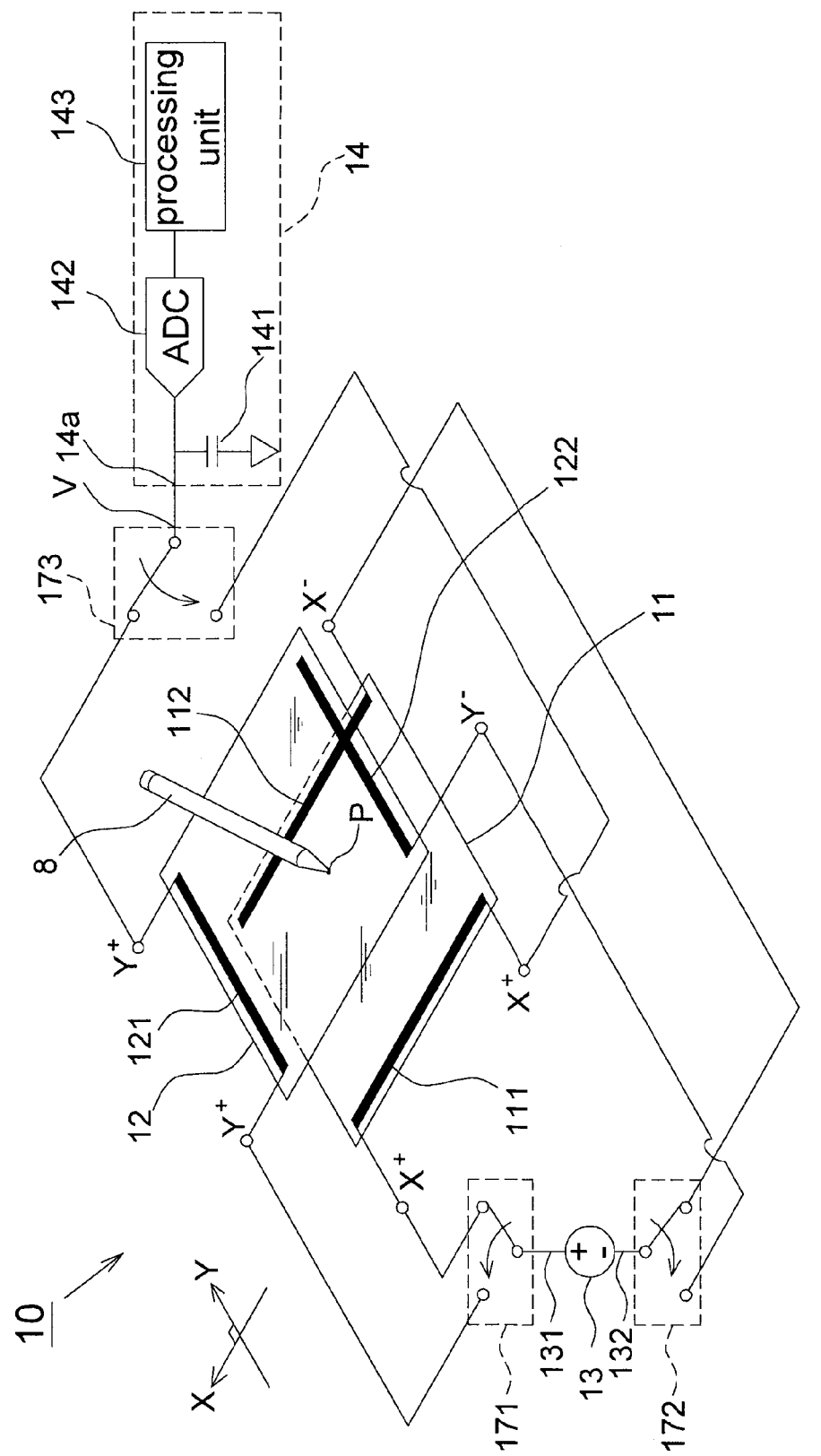
FIG. 4a shows a schematic diagram of the electronic device according to an embodiment of the present invention.

Please refer to FIGS. 4a, it shows a schematic diagram of the electronic device 10 according to an embodiment of the present invention. It is appreciated that FIG. 4a only shows components for illustrating the present invention and omits other components. Embodiments of the electronic device 10 include, but not limited to, a personal digital assistant (PDA), a handwriting device, a notebook and a portable communication device. The electronic device 10 includes an X film 11, a Y film 12, a power source 13, a detection unit 14 and a plurality of switching elements 171-173, wherein the switching elements 171-173 may be, but not limited to, switching transistors.

In this embodiment, the X film 11 and the Y film 12 compose a resistive touching sensing element, which may be, but not limited to, a touch screen or a touch pad. The X film 11 includes two electrodes $X^+$ and $X^-$ formed at two opposite sides on the X film 11 along an X direction, and a transparent layer (not numbered) formed on the upper surface of the X film 11. The Y film 12 includes two electrodes $Y^+$ and $Y^-$ formed at two opposite sides on the Y film 12 along a Y direction, and a transparent layer (not numbered) formed on the bottom surface of the Y film 12. The power source 13 has a high voltage terminal 131 and a low voltage terminal 132, wherein the high voltage terminal 131 is selectively coupled to the electrode $X^+$ of the X film 11 or the electrode $Y^+$ of the Y film 12 through the switching element 171 while the low voltage terminal 132 is selectively coupled to the electrode $X^-$ of the X film 11 or the electrode $Y^-$ of the Y film 12 through the switching element 172. In another embodiment, the X film 11 may be located above the Y film 12; and two transparent layers are respectively formed at the bottom surface of the X film 11 and the upper surface of the Y film 12.

The detection unit 14 is configured to detect a voltage V outputted from the X film 11 and the Y film 12, to identify whether a contact event is a valid contact according to a variation of the voltage V, and to calculate the position coordinate of a touch point P on the X film 11 and the Y film 12, wherein the voltage V is a division voltage of the power source 13. An input terminal 14a of the detection unit 14 is coupled to the electrode $X^+$ of the X film 11 or the electrode $Y^+$ of the Y film 12 through the switching element 173 for detecting the voltage V of the electrode $X^+$ or $Y^+$. In another embodiment, the input terminal 14a of the detection unit 14 may also be coupled to the electrode $X^-$ of the X film 11 or the electrode $Y^-$ of the Y film 12 through the switching element 173 for detecting the voltage V on the electrode $X^-$ or $Y^-$. It is appreciated that the line connection shown in FIG. 4a is only an exemplary embodiment, but not a limitation, of the present invention. The connection between the X film 11, the Y film 12 and the power source 13, the detection unit 14 is not limited to that shown in FIG. 4a.

Figure 4B:
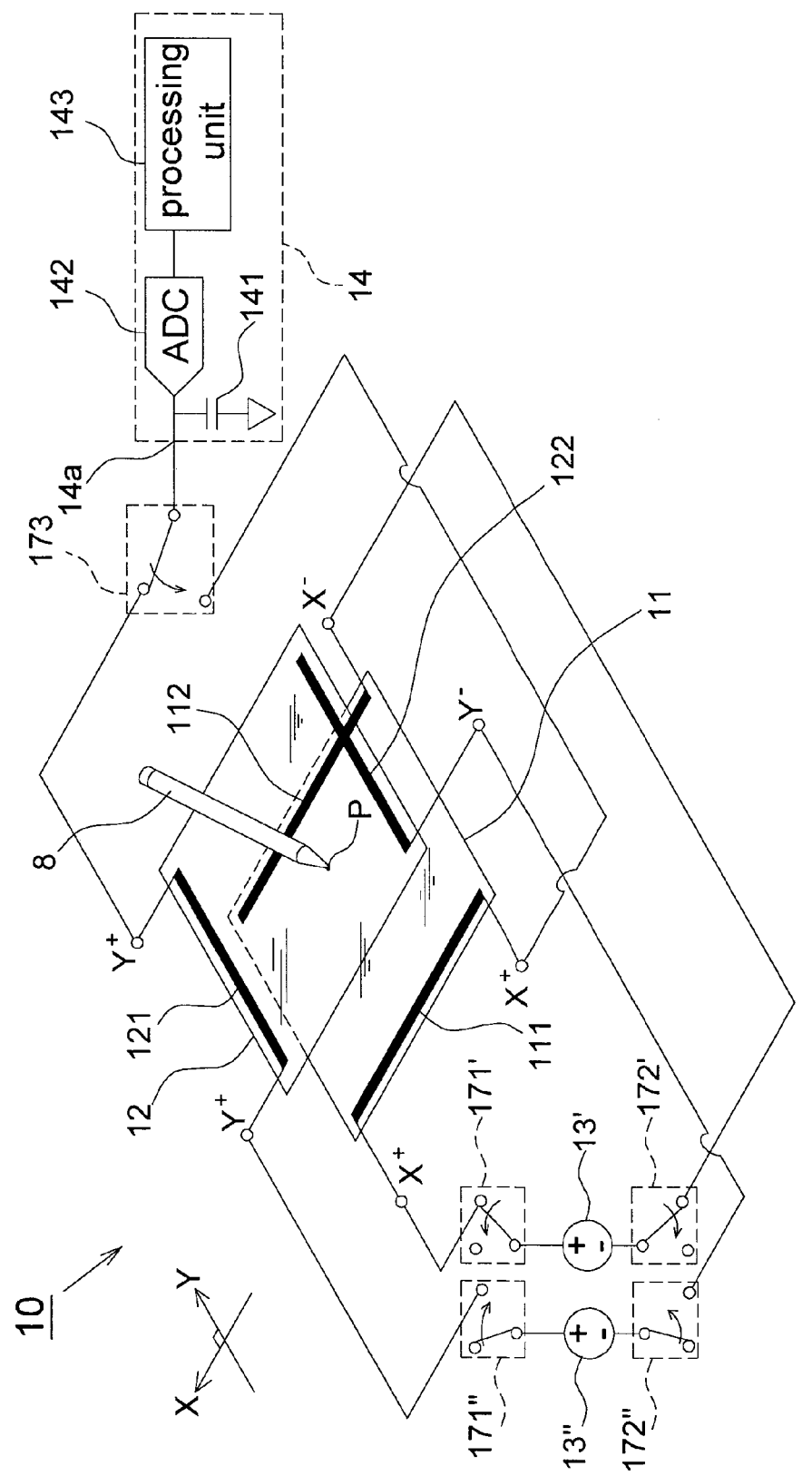
FIG. 4b shows a schematic diagram of the electronic device according to another embodiment of the present invention.

Please refer to FIG. 4b, for example in one embodiment, a first power source 13' is configured to supply power to the X film 11, wherein a high voltage terminal of the first power source 13' may be coupled to the electrode $X^+$ of the X film 11 through a switching element 171' while a low voltage terminal of the first power source 13' may be coupled to the electrode $X^-$ of the X film 11 through a switching element 172'. A second power source 13" is configured to supply power to the Y film 12, wherein a high voltage terminal of the second power source 13" may be coupled to the electrode $Y^+$ of the Y film 12 through a switching element 171" while a low voltage terminal of the second power source 13" may be coupled to the electrode $Y^-$ of the Y film 12 through a switching element 172". The detection unit 14 may be coupled to the electrode $X^+$ (or $X^-$) of the X film 11 or the electrode $Y^+$ (or $Y^-$) of the Y film 12 through the switching element 173 for detecting the voltage V outputted from the X film 11 or the Y film 12. The switching elements 171', 171", 172', 172" and 173 shown in FIG. 4b may be switching transistors.

The detection unit 14 includes a capacitor 141, an analog-to-digital converter (ADC) 142 and a processing unit 143. A terminal of the capacitor 141 is coupled to the input terminal 14a of the detection unit 14 while the other terminal of the capacitor 141 is coupled to a reference voltage. A division voltage on the X film 11 or the Y film 12 charges the capacitor 141. An input terminal of the ADC 142 is coupled to the first terminal of the capacitor 141 for converting a charged voltage V on the first terminal of the capacitor 141 to a digital voltage value. The processing unit 143 is coupled to the ADC 142 for identifying whether a contact event is a valid contact according to the digital voltage value outputted by the ADC 142. When the processing unit 143 identifies that a contact event is a valid contact, the processing unit 143 post-processes the digital voltage value, e.g. calculating the position coordinate of a touch point P on the X film 11 or the Y film 12 and executing a function corresponding to the position coordinate. The method to identify whether a contact event is a valid contact will be illustrated hereinafter.

Figure 4C:
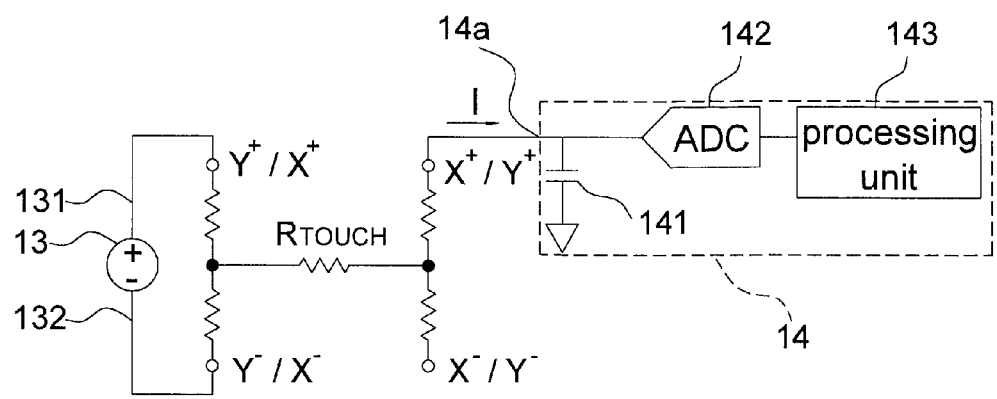

Please refer to FIGS. 4a and 4c, FIG. 4c shows an equivalent circuit diagram of the electronic device 10 shown in FIG. 4a. When an object 8, e.g. a pen or a finger, touches a touch point P on the Y film 12, a contact resistance $r_{TOUCH}$ is formed between the X film 11 and the Y film 12 as shown in FIG. 4c.

When it is required to detect an X position coordinate of the touch point P, the high voltage terminal 131 of the power source 13 is coupled to the electrode $Y^+$ of the Y film 12 through the switching element 171 and the low voltage terminal 132 of the power source 13 is coupled to the electrode $Y^-$ of the Y film 12 through the switching element 172, and the detection unit 14 is coupled to the electrode $X^+$ (or $X^-$) of the X film 11 through the switching element 173. At this moment, the power source 13 generates a division voltage V and a charging current I on the electrode $X^+$ (or $X^-$) to charge the capacitor 141, wherein when the contact pressure of the object 8 is larger, the contact resistance $R_{TOUCH}$ becomes smaller and the charging current I becomes larger such that the capacitor 141 will be charged to a predetermined voltage value, e.g. identical to the voltage on the electrode $X^+$ (or $X^-$) (i.e. the division voltage V), in a shorter time period. The ADC 142 samples a charged voltage of the capacitor 141 and converts the sampled voltage values to digital voltage values. The processing unit 141 identifies whether the charged voltage of the capacitor 141 reaches a stable state after being charged for a predetermined time period according to the digital voltage values, wherein when the processing unit 143 identifies that the charged voltage of the capacitor 141 does not reach a stable state, the sampled voltages will be ignored; while when the processing unit 143 identifies that the charged voltage of the capacitor 141 reaches a stable state, the sampled voltages will be post-processed.

Similarly, when it is required to detect the Y position coordinate of the touch point P, the high voltage terminal of the power source 13 is coupled to the electrode $X^+$ of the X film 11 through the switching element 171 and the low voltage terminal of the power source 13 is coupled to the electrode $X^-$ of the X film 11 through the switching element 172, and the detection unit 14 is coupled to the electrode $Y^+$ (or $Y^-$) of the Y film 11 through the switching element 173. At this moment, the power source 13 generates a division voltage V and a charging current I on the electrode $Y^+$ (or $Y^-$) to charge the capacitor 141. The ADC 142 also samples a charged voltage of the capacitor 141 and converts the sampled voltage values to digital voltage values. The processing unit 141 identifies whether the charged voltage of the capacitor 141 reaches a stable state after being charged for a predetermined time period according to the digital voltage values.

A method that the processing unit 143 identifies whether the charged voltage of the capacitor 141 reaches a stable state will be illustrated hereinafter. Please refer to FIGS. 4a, 4c and 5 together, when a first time period $T_1$ begins, the power source 13 is coupled to the electrodes $Y^+$ and $Y^-$ (or $X^+$ and $X^-$) through the switching elements 171 and 172, and the detection unit 14 is coupled to the electrode $X^+$ or $X^-$ ($Y^+$ or $Y^-$) through the switching element 173. Within the first time period $T_1$, a division voltage V on the electrode $X^+$ or $X^-$ ($Y^+$ or $Y^-$) charges the capacitor 141 to a predetermined voltage value. Within a second time period $T_2$, the ADC 142 samples the charged voltage of the capacitor 141 and converts the sampled voltage values to digital voltage values. The processing unit 143 identifies that whether the charged voltage of the capacitor 141 reaches a stable state according to the digital voltage values.

Figure 5:
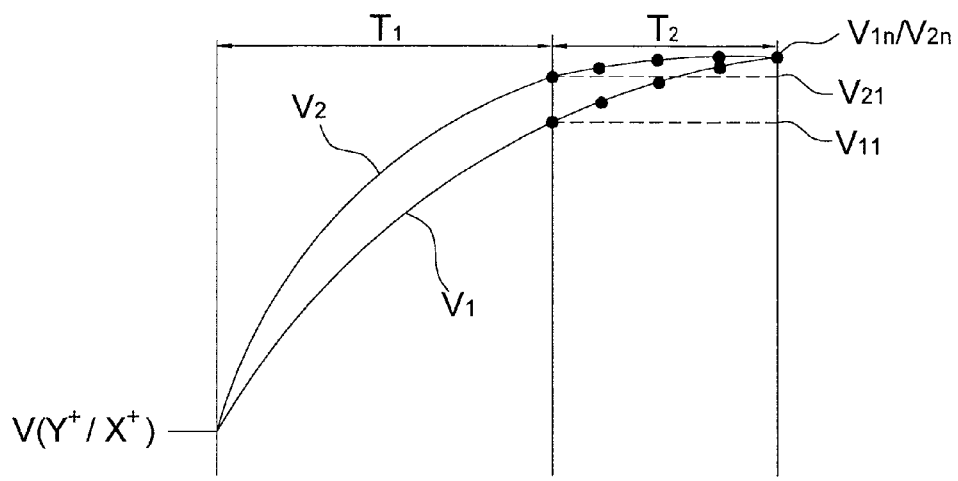
FIG. 5 shows a schematic diagram of the method for detecting pressure on a touch sensing element according to the embodiment of the present invention.

For example in FIG. 5, when the object 8 touches the Y film 12 with a relatively smaller force, a larger contact resistance $T_{TOUCH}$ is formed between the X film 11 and the Y film 12. When the power source 13 is coupled to the electrodes $Y^+$ and $Y^-$ (or $X^+$ and $X^-$) and the detection unit 14 is coupled to the electrode $X^+$ or $X^-$ ($Y^+$ or $Y^-$), the charged voltage of the capacitor 141 changes, for example, as the curve $V_1$ in the first time period $T_1$; and in the second time period $T_2$, the ADC 142 starts to sample the rear section of the charged voltage $V_1$ to obtain a plurality of digital voltage values. The processing unit 143 calculates a variation of the sampled voltage values and accordingly identifies whether the sampled voltage values reach a stable state, e.g. the processing unit 143 calculates a difference between two adjacent sampled voltage values, a difference between two sampled voltage values, an average of a plurality of differences between two adjacent sampled voltage values or a variation of a plurality of differences between two adjacent sampled voltage values, and compares a calculated result with a predetermined threshold value. When the variation of sampled voltage values is larger than the threshold value, a stable state is not reached; on the contrary, when the variation of sampled voltage values is smaller than the threshold value, a stable state is reached. For example in one embodiment, the processing unit 143 samples the voltage $V_{11}$ at a start point and the voltage $V_{1n}$ at an end point of the second time period $T_2$, and calculates their difference ($V_{1n}-V_{11}$). Next, the processing unit 143 compares the difference ($V_{1n}-V_{11}$) with a threshold value to identify the variation of the charged voltage of the capacitor 141.

Similarly, when the object 8 touches the Y-film 12 with a relatively larger force, a smaller contact resistance $R_{TOUCH}$ is formed between the X film 11 and the Y film 12. When the power source 13 is coupled to the electrodes $Y^+$ and $Y^-$ (or $X^+$ and $X^-$) and the detection unit 14 is coupled to the electrode $X^+$ or $X^-$ ($Y^+$ or $Y^-$), the charged voltage of the capacitor 141 changes, for example, as the curve $V_2$ in the first time period $T_1$. In the second time period $T_2$, the ADC 142 samples the charged voltage $V_2$ and obtains a plurality of digital voltage values. The processing unit 143 identifies whether the sampled voltage values reach a stable state. It is appreciated that, the sample number that the ADC 142 samples the charged voltage of the capacitor 141 may be determined according to different applications, and the higher the sample number is, the more accurate detection result can be obtained. The length of the second time period $T_2$ may be determined according to actual applications, and the longer the second time period $T_2$ is, the more accurate detection result can be obtained. In another embodiment, the voltage curves $V_1$ and $V_2$ shown in FIG. 5 may be the charged voltage of the capacitor 141 respectively when the capacitor 141 is coupled to the electrode $X^+$ or $X^-$ of the X film and the electrode $Y^+$ or $Y^-$ of the Y film.

Figure 6:
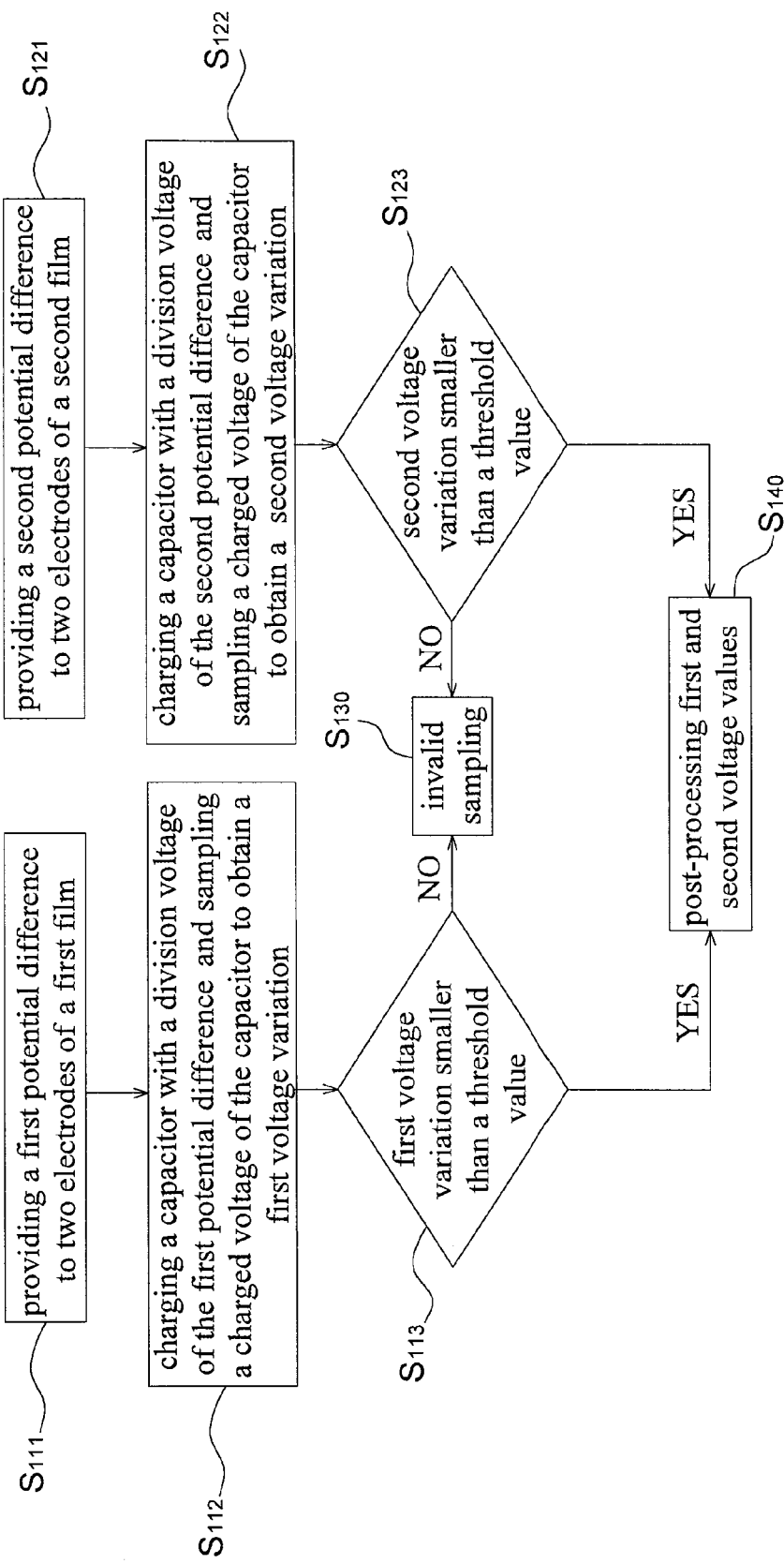
FIG. 6 shows a flow chart of the method for detecting pressure on a touch sensing element according to an embodiment of the present invention.

Please refer to FIG. 6, it shows a flow chart of the method for detecting pressure on a touch sensing element according to an embodiment of the present invention. The method includes the steps of: providing a first potential difference to two electrodes of a first film (step $S_{111}$); charging a capacitor with a division voltage of the first potential difference, sampling a charged voltage of the capacitor to obtain a plurality of first voltage values, and calculating a first voltage variation according to the plurality of first voltage values (step $S_{112}$); providing a second potential difference to two electrodes of a second film (step $S_{121}$); charging a capacitor with a division voltage of the second potential difference, sampling a charged voltage of the capacitor to obtain a plurality of second voltage values, and calculating a second voltage variation according to the plurality of second voltage values (step $S_{122}$); comparing the first voltage variation and the second voltage variation with a threshold value (steps $S_{113}$ and $S_{123}$); when one of the first voltage variation and the second voltage variation is larger than the threshold value, identifying that the sampling is invalid (step $S_{130}$); and when both the first voltage variation and the second voltage variation are smaller than the threshold value, post-processing at least one of the plurality of first voltage values and second voltage values (step $S_{140}$). In this embodiment, the first potential difference and the second potential different in steps $S_{111}$ and $S_{121}$ may be identical or different potential differences, and the threshold values in steps $S_{113}$ and $S_{123}$ may be identical or different threshold values.

Please refer to FIGS. 4a to 6 together, at a start of a first time period $T_1$, the power source 13 is coupled to the two electrodes $Y^+$ and $Y^-$ (or $X^+$ and $X^-$) of the Y film (or the X film) through the switching elements 171 and 172, and the detection unit 14 is coupled to one of the two electrodes $X^+$ and $X^-$ (or $Y^+$ and $Y^-$) of the X film (or the Y film). In this embodiment, the voltage curves $V_1$ and $V_2$ shown in FIG. 5 are the charged voltages of the capacitor 141 when the capacitor 141 is coupled to the X film (or Y film) and the Y film (or X film) respectively.

The voltage on the electrode ($X^+$ or $X^-$) coupled to the detection unit 14 charges the capacitor 141 within the first time period $T_1$ (step $S_{111}$). The ADC 142 samples the charged voltage of the capacitor 141 within the second time period $T_2$ and obtains a plurality of first voltage values ($V_{11}$ to $V_{1n}$ or $V_{21}$ to $V_{2n}$ shown in FIG. 5), and calculates a first voltage variation according to the plurality of first voltage values, e.g. a variation of the charged voltage value $V_1$ (step $S_{112}$), wherein the calculated first voltage variation may be stored in the processing unit 143. Next, the power source 13 is coupled to the two electrodes $X^+$ and $X^-$ (or $Y^+$ and $Y^-$) of the X film (or the Y film) through the switching elements 171 and 172, and the detection unit 14 is coupled to one of the two electrodes $Y^+$ and $Y^-$ (or $X^+$ and $X^-$) of the Y film (or the X film).

The voltage on the electrode ($Y^+$ or $Y^-$) coupled to the detection unit 14 charges the capacitor 141 within the first time period $T_1$ (step $S_{121}$). The ADC 142 samples the charged voltage of the capacitor 141 within the second time period $T_2$ and obtains a plurality of second voltage values ($V_{21}$ to $V_{2n}$ or $V_{11}$ to $V_{1n}$ shown in FIG. 5), and calculates a second voltage variation according to the plurality of second voltage values, e.g. a variation of the charged voltage value $V_2$ (step $S_{122}$). Next, the processing unit 143 compares the first voltage variation and the second voltage variation with a predetermined threshold value, wherein the threshold value may be determined according to the detection accuracy required by the electronic device 10 (steps $S_{113}$ and $S_{123}$). When one of the first voltage variation and the second voltage variation is larger than the threshold value, the charged voltage does not reach a stable state, i.e. the processing init 143 identifies that the sampling is invalid and will ignore the sampled first and second voltage values, and the detecting process will be ended (step $S_{130}$). When both the first voltage variation and the second voltage variation are smaller than the threshold value, the first voltage values and the second voltage values reach a stable state, and processing unit 143 post-processes at least one of the plurality of first voltage values and at least one of the plurality of the second voltage values (step $S_{140}$). For example, the processing unit 143 calculates the position coordinate of a touch point P according to the first voltage value $V_{1n}$ (or $V_{2n}$) and the second voltage value $V_{2n}$ (or $V_{1n}$), and executes a function corresponding to the position coordinate. It is appreciated that either the first voltage variation or the second voltage variation value may be calculated first.

In the embodiment of the present disclosure, the first voltage variation may be a difference between two adjacent first voltage values, a difference between two first voltage values, an average of a plurality of differences between two adjacent first voltage values or a variation of a plurality of differences between two adjacent first voltage values. Similarly, the second voltage variation may be a difference between two adjacent second voltage values, a difference between two second voltage values, an average of a plurality of differences between two adjacent second voltage values or a variation of a plurality of differences between two adjacent second voltage values.

Figure 7:
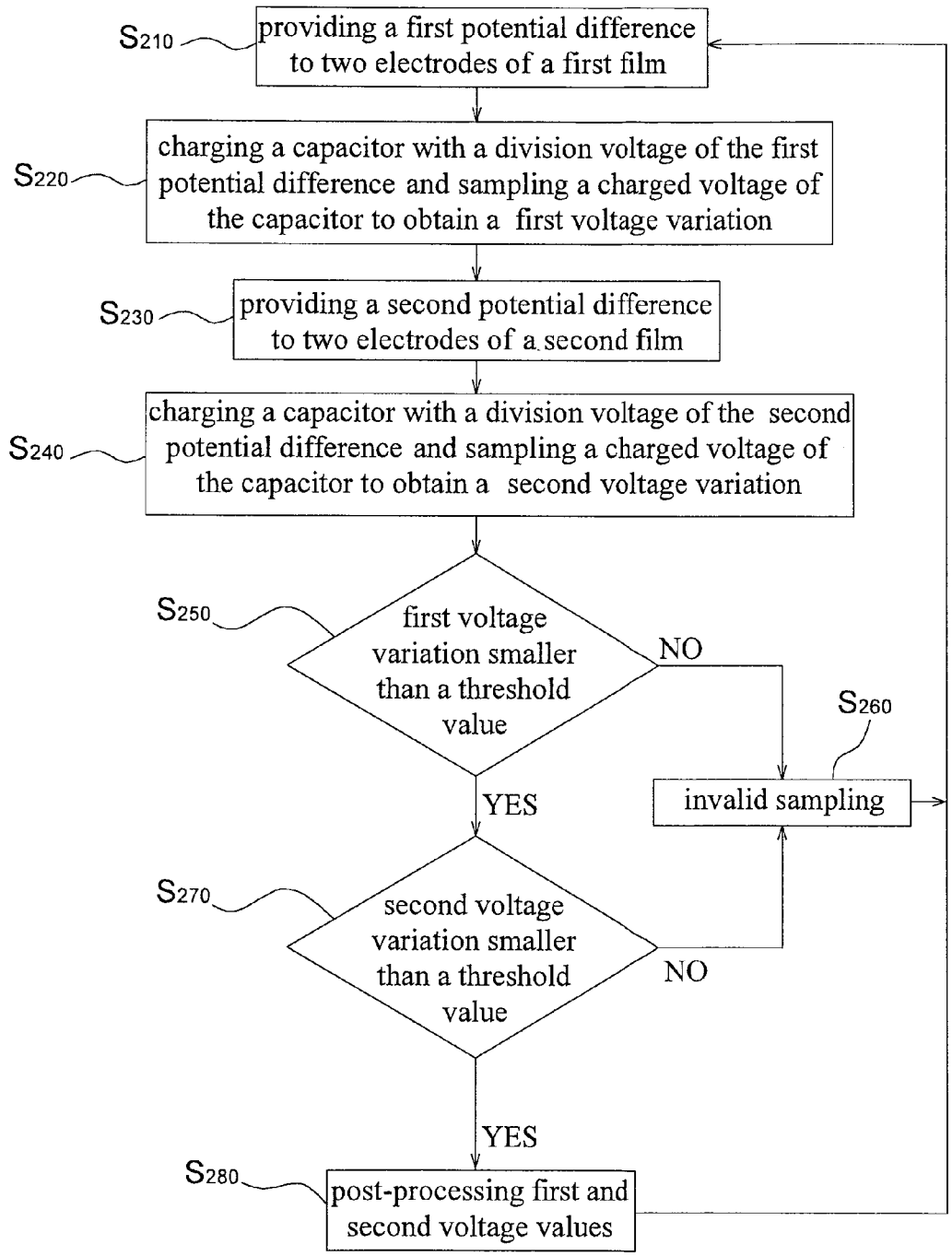
FIG. 7 shows a flow chart of the method for detecting pressure on a touch sensing element according to another embodiment of the present invention.

Please refer to FIG. 7, it shows a flow chart of the method for detecting pressure on a touch sensing element according to another embodiment of the present invention. The method includes the steps of:

Step $S_{210}$: providing a first potential difference to two electrodes of a first film.

Step $S_{220}$: charging a capacitor with a division voltage of the first potential difference, sampling a charged voltage of the capacitor to obtain a plurality of first voltage values, and calculating a first voltage variation according to the plurality of first voltage values.

Step $S_{230}$: providing a second potential difference to two electrodes of a second film.

Step $S_{240}$: charging a capacitor with a division voltage of the second potential difference, sampling a charged voltage of the capacitor to obtain a plurality of second voltage values, and calculating a second voltage variation according to the plurality of second voltage values.

Step $S_{250}$: comparing the first voltage variation with a threshold value, and going to step $S_{260}$ when the first voltage variation is larger than the threshold value or going to step $S_{270}$ when the first voltage variation is smaller than the threshold value.

Step $S_{260}$: identifying that the sampling is invalid.

Step $S_{270}$: comparing the second voltage variation with a threshold value, and going to step $S_{260}$ when the second voltage variation is larger than the threshold value or going to step $S_{280}$ when the second voltage variation is smaller than the threshold value.

Step $S_{280}$: post-processing at least one of the plurality of first voltage values and second voltage values; wherein the post-processing may includes, but not limited to, calculating a position coordinate of a touch point according to at least one of the first voltage values and at least one of the second voltage values and/or executing a function corresponding to the position coordinate.

Differences between this embodiment and FIG. 6 are in that, in this embodiment the processing unit 143 first identifies whether the first voltage values reach a stable state or not (i.e. whether the first voltage variation is smaller than the threshold value), and the processing unit 143 ignores all sampled voltage values and ends the detecting process when the first voltage values do not reach a stable state (step $S_{260}$) and returns to step $S_{210}$ to restart a new detecting process. In addition, details of every step in this embodiment are similar to those illustrated in FIG. 6 and thus will not be repeated herein. In another embodiment, the sequence of steps $S_{250}$ and $S_{270}$ may be exchanged.

Figure 8:
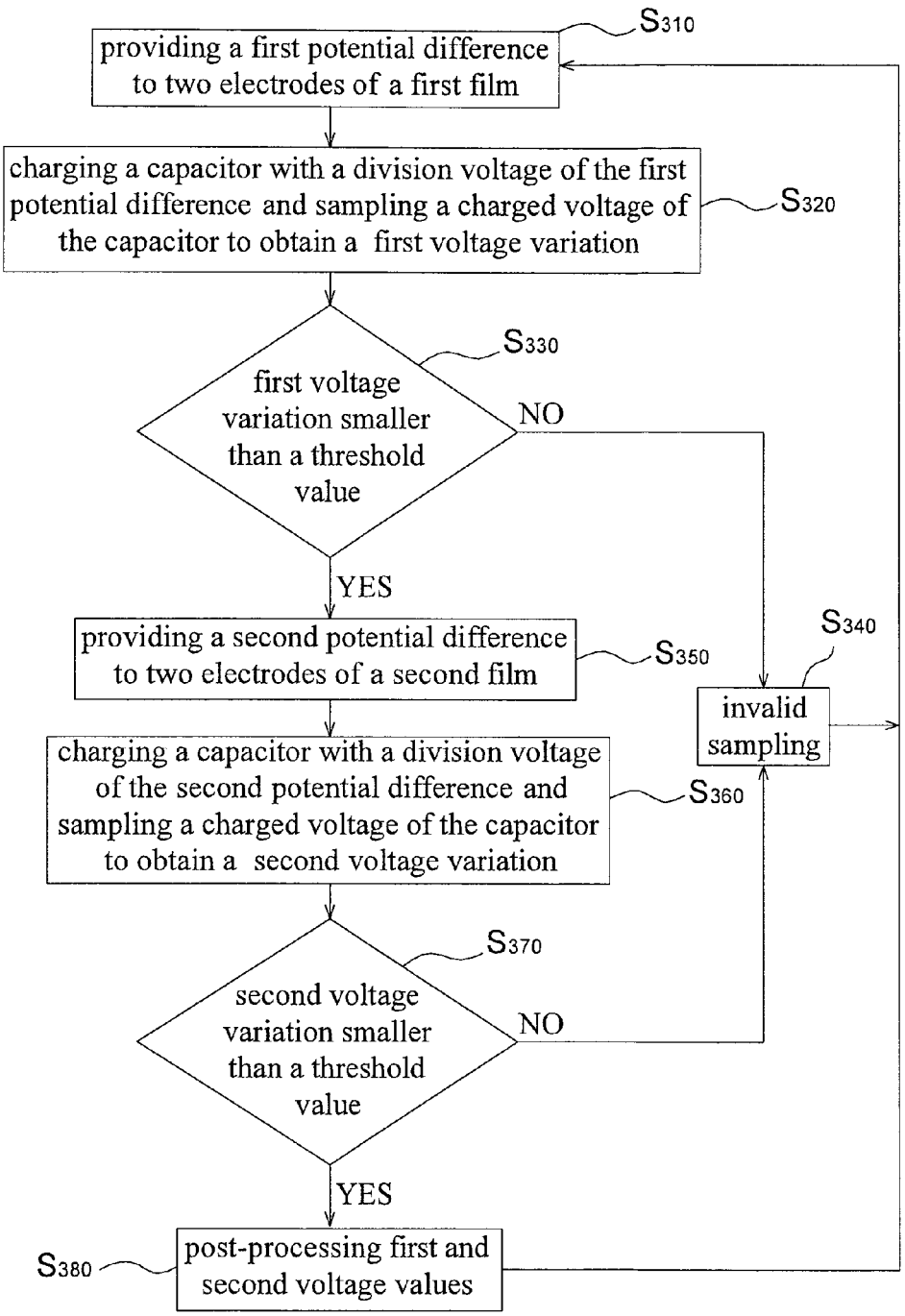
FIG. 8 shows a flow chart of the method for detecting pressure on a touch sensing element according to a further embodiment of the present invention.

Please refer to FIG. 8, it shows a flow chart of the method for detecting pressure on a touch sensing element according to another embodiment of the present invention. The method includes the steps of:

Step $S_{310}$: providing a first potential difference to two electrodes of a first film.

Step $S_{320}$: charging a capacitor with a division voltage of the first potential difference, sampling a charged voltage of the capacitor to obtain a plurality of first voltage values, and calculating a first voltage variation according to the plurality of first voltage values.

Step $S_{330}$: comparing the first voltage variation with a threshold value, and going to step $S_{340}$ when the first voltage variation is larger than the threshold value or going to step $S_{350}$ when the first voltage variation is smaller than the threshold value.

Step $S_{340}$: identifying that the sampling is invalid.

Step $S_{350}$: providing a second potential difference to two electrodes of a second film.

Step $S_{360}$: charging a capacitor with a division voltage of the second potential difference, sampling a charged voltage of the capacitor to obtain a plurality of second voltage values, and calculating a second voltage variation according to the plurality of second voltage values.

Step $S_{370}$: comparing the second voltage variation with a threshold value, and going to step $S_{340}$ when the second voltage variation is larger than the threshold value or going to step $S_{380}$ when the second voltage variation is smaller than the threshold value.

Step $S_{380}$: post-processing at least one of the plurality of first voltage values and second voltage values; wherein the post-processing may include, but not limited to, calculating a position coordinate of a touch point according to at least one of the first voltage values and at least one of the second voltage values and/or executing a function corresponding to the position coordinate.

Differences between this embodiment and FIG. 6 are in that, in this embodiment the detection unit 14 first samples the electrode voltage of the X film or the Y film, and identifies whether the sampled voltage values reach a stable state or not. If a stable state is not reached, the detecting process is immediately ended and returns to step $S_{310}$ to restart a new detecting process. When the electrode voltage of the X film or the Y film reaches a stable state, the electrode voltage of the other film will then be sampled and identified. In this manner, the operation efficiency of the detection unit 14 can be increased. In addition, details of every step in this embodiment are similar to those shown in FIG. 6 and thus will be repeated herein.

In the illustration mentioned above, the X direction is perpendicular to the Y direction, e.g. they may be respectively the length direction and the width direction of a display screen of a touch pad.

As mentioned above, as the conventional touch screen identifies a contact pressure by calculating a contact resistance, it has lower accuracy and easily causes a misidentification. The present disclosure further provides a method for detecting pressure on a touch sensing element and an electronic device using the same that identifies whether a contact event is a valid contact by detecting a variation of the charged voltage on a capacitor. Since it is not necessary to directly calculate contact resistance, higher position accuracy can be obtained.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for detecting pressure on a touch sensing element, the touch sensing element comprising a first film and a second film each comprising two electrodes, the method comprising:

providing a first potential difference to the two electrodes of the first film;

charging a capacitor with a division voltage of the first potential difference;

sampling a charged voltage of the capacitor to obtain a plurality of first voltage values and calculating a first voltage variation according to the plurality of first voltage values;

comparing the first voltage variation with a threshold value; and post-processing at least one of the first voltage values when the first voltage variation is smaller than the threshold value.

2. The method as claimed in claim 1, further comprising: ignoring the plurality of first voltage values when the first voltage variation is larger than the threshold value.

3. The method as claimed in claim 1, wherein the first voltage variation is a difference between two adjacent first voltage values, a difference between two first voltage values, an average of a plurality of differences between two adjacent first voltage values or a variation of a plurality of differences between two adjacent first voltage values.

4. The method as claimed in claim 3, further comprising:

providing a second potential difference to the two electrodes of the second film;

charging the capacitor with a division voltage of the second potential difference;

sampling a charged voltage of the capacitor to obtain a plurality of second voltage values and calculating a second voltage variation according to the plurality of second voltage values;

comparing the second voltage variation with the threshold value;

ignoring the plurality of first and second voltage values when one of the first voltage variation and the second voltage variation is larger than the threshold value; and post-processing at least one of the first voltage values and at least one of the second voltage values when both the first voltage variation and the second voltage variation are smaller than the threshold value.

5. The method as claimed in claim 4, wherein the second voltage variation is a difference between two adjacent second voltage values, a difference between two second voltage values, an average of a plurality of differences between two adjacent second voltage values or a variation of a plurality of differences between two adjacent second voltage values.

6. The method as claimed in claim 4, wherein the step of sampling a charged voltage of the capacitor to obtain a plurality of first voltage values starts after the first potential difference is provided to the two electrodes of the first film for a first predetermined time period; and the step of sampling a charged voltage of the capacitor to obtain a plurality of second voltage values starts after the second potential difference is provided to the two electrodes of the second film for a second predetermined time period.

7. The method as claimed in claim 1, wherein the step of post-processing further comprises:
   calculating a position coordinate according to at least one of the first voltage values; and
   executing a function corresponding to the position coordinate.

8. The method as claimed in claim 1, further comprising:
   providing a first predetermined time period; and
   sampling the charged voltage of the capacitor to obtain the plurality of first voltage values after the first predetermined time period.

9. An electronic device, comprising:
   a first film having two electrodes;
   a second film having two electrodes;
   a power source configured to provide a potential difference to the two electrodes of the first film or the two electrodes of the second film;
   a capacitor configured to be selectively coupled to one of the two electrodes of the first film or one of the two electrodes of the second film, and to be charged by a division voltage of the potential difference on the electrode coupled thereto; and
   a processing unit configured to sample a charged voltage of the capacitor to obtain a plurality of voltage values, to calculate a voltage variation according to the plurality of voltage values, and to compare the voltage variation with a threshold value, wherein the processing unit post-processes at least one of the plurality of voltage values when the voltage variation is smaller than the threshold value.

10. The electronic device as claimed in claim 9, wherein the processing unit ignores the plurality of voltage values when the voltage variation is larger than the threshold value.

11. The electronic device as claimed in claim 9, wherein the two electrodes of the first film are respectively formed at two opposite sides on the first film along a first direction while the two electrodes of the second film are respectively formed at two opposite sides on the second film along a second direction.

12. The electronic device as claimed in claim 9, wherein the power source is selectively coupled to the two electrodes of the first film or to the two electrodes of the second film through a switching element.

13. The electronic device as claimed in claim 12, wherein the capacitor is selectively coupled to one of the two electrodes of the first film or to one of the two electrodes of the second film through a switching element.

14. The electronic device as claimed in claim 13, wherein the capacitor is coupled to one of the two electrodes of the second film when the power source is coupled to the two electrodes of the first film; while the capacitor is coupled to one of the two electrodes of the first film when the power source is coupled to the two electrodes of the second film.

15. The electronic device as claimed in claim 9, further comprising an analog-to-digital converter, which is coupled to the capacitor and configured to convert the charged voltage of the capacitor to the plurality of voltage values.

16. The electronic device as claimed in claim 9, wherein the voltage variation is a difference between two adjacent voltage values, a difference between two voltage values, an average of a plurality of differences between two adjacent voltage values or a variation of a plurality of differences between two adjacent voltage values.

17. The electronic device as claimed in claim 9, wherein the post-processing performed by the processing unit is to calculate a position coordinate according to at least one of the voltage values and to execute a function corresponding to the position coordinate.

18. A method for detecting pressure on a touch sensing element, the touch sensing element comprising a first film and a second film each comprising two electrodes, the method comprising:
   providing a first potential difference to the two electrodes of the first film;
   charging a capacitor with a division voltage of the first potential difference;
   sampling a charged voltage of the capacitor to obtain a plurality of first voltage values;
   identifying whether the first voltage values reach a stable state;
   ending pressure detecting when the first voltage values do not reach the stable state;
   when the first voltage values reach the stable state, the method further comprising:
      providing a second potential difference to the two electrodes of the second film;
      charging the capacitor with a division voltage of the second potential difference;
      sampling a charged voltage of the capacitor to obtain a plurality of second voltage values;
      identifying whether the second voltage values reach the stable state;
      ending pressure detecting when the second voltage values do not reach the stable state;
      post-processing at least one of the first voltage values and at least one of the second voltage values when the second voltage values reach the stable state.

19. The method as claimed in claim 18, wherein when a variation of the first voltage values is smaller than a threshold value, the first voltage values reach the stable state; when a variation of the second voltage values is smaller than the threshold value, the second voltage values reach the stable state.

20. The method as claimed in claim 19, wherein the variation of the first voltage values is a difference between two adjacent first voltage values, a difference between two first voltage values, an average of a plurality of differences between two adjacent first voltage values or a variation of a plurality of differences between two adjacent first voltage values; the variation of the second voltage values is a difference between two adjacent second voltage values, a difference between two second voltage values, an average of a plurality of differences between two adjacent second voltage values or a variation of a plurality of differences between two adjacent second voltage values.

* * * * *